US006988014B2

(12) United States Patent
Kraemer et al.

(10) Patent No.: US 6,988,014 B2
(45) Date of Patent: Jan. 17, 2006

(54) RE-USABLE ELEMENTS OF A CONFIGURATION MODEL

(75) Inventors: Andreas Kraemer, Berlin (DE); Andreas Steiner, Mannheim (DE); Bernhard Teltscher, Speyer (DE); Stein Wanvik, Wiesloch (DE); Albert Haag, Bad Duerkheim (DE)

(73) Assignee: SAP Aktiengesellschaft, (DE)

( * ) Notice: Subject to any disclaimer, the term of this patent is extended or adjusted under 35 U.S.C. 154(b) by 217 days.

(21) Appl. No.: 10/366,627

(22) Filed: Feb. 12, 2003

(65) Prior Publication Data

US 2004/0012634 A1 Jan. 22, 2004

Related U.S. Application Data

(63) Continuation-in-part of application No. 10/291,175, filed on Nov. 7, 2002.

(60) Provisional application No. 60/338,105, filed on Nov. 7, 2001.

(51) Int. Cl.
*G06F 19/00* (2006.01)

(52) U.S. Cl. ........................................ 700/97
(58) Field of Classification Search .................. 700/97; 703/1–2
See application file for complete search history.

(56) References Cited

U.S. PATENT DOCUMENTS

| 5,434,791 A | 7/1995 | Koko et al. ............ 700/97 |
| 6,002,854 A * | 12/1999 | Lynch et al. ............ 703/1 |
| 2003/0090527 A1 | 5/2003 | Kamino ................. 713/810 |

FOREIGN PATENT DOCUMENTS

| EP | 0 483 039 A2 | 4/1992 |
| EP | 0 520 923 A2 | 12/1992 |
| WO | WO 86/00735 | 1/1986 |

OTHER PUBLICATIONS de Kleer, Johan, "An Assumption-based TMS," Artificial Intelligence 28:127-162 (1986).
Doyle, Jon, "A Truth Maintenance System," *Artificial Intelligence*, 12:231-272 (1979).
Haag, Albert, "Sales Configuration in Business Processes," IEEE Intelligent Systems, Jul./Aug. 1998, pp. 78-85.
Heinrich, M., et al, "A Resource-Based Paradigm for the Configuring of Technical Systems from Modular Components," Proceedings of the 7th IEEE Conference on Artificial Intelligence Applications (CAIA), pp. 257-264.
Juengst, Werner E., et al., "Using Resource Balancing to Configure Modular Systems," IEEE Intelligent Systems 13(4):50-58 (1998).

* cited by examiner

*Primary Examiner*—Leo Picard
*Assistant Examiner*—Alexander Kosowski
(74) *Attorney, Agent, or Firm*—Fish & Richardson P.C.

(57) ABSTRACT

Methods and apparatus, including computer program products, for a multi-purpose configuration model. A computer program product, tangibly stored on a machine-readable medium, for defining a configuration model for a configurable product, includes instructions operable to cause a programmable processor to receive input. The product includes instructions to define, based on the input, a base component of the configuration model, the base component including information that describes the product. The product includes instructions to include, as a child object of the base component, a reused subcomponent that was previously defined, the reused subcomponent including information that describes the product.

37 Claims, 15 Drawing Sheets

| Characteristics | Characteristic Values |
|---|---|
| 302 → Exterior Color: | 314 → Red<br>316 → Blue<br>318 → Black<br>320 → Green |
| 304 → Air Conditioning: | 322 → Manual Air Conditioning<br>324 → Automatic Air Conditioning<br>326 → No |
| 306 → Seat Heating: | 328 → Yes<br>330 → No |
| 308 → Airbags: | 332 → Driver<br>334 → Passenger<br>336 → Side Curtain |
| 310 → Steering Wheel: | 338 → Leather Multifunction<br>340 → Wood |
| 312 → Seats: | 342 → Sport Seats<br>344 → Standard |

| Characteristics | Characteristic Values |
|---|---|
| *Battery:* | *Reinforced* <br> *Not Reinforced* |

┌─ 352
*Constraint: If Exterior Color is Black, Then Air Conditioning is Automatic Air Conditioning*

| Characteristics | Characteristic Values |
|---|---|
| *Exterior Color:* | *Red* <br> *Blue* <br> *Black* |

FIG. 3D

| Characteristics | Characteristic Values |
|---|---|
| Sports Package: | Automatic Air, Leather Multifunctional, Sport Seats |

*FIG. 3E*

| Characteristics | Characteristic Values |
|---|---|
| Exterior Color: | Red<br>Blue<br>Black<br>Green |
| Air Conditioning: | Manual Air Conditioning<br>Automatic Air Conditioning<br>No |
| Seat Heating: | Yes<br>No |
| Airbags: | Driver<br>Passenger<br>Side Curtain |
| Steering Wheel: | Leather Multifunction<br>Wood |
| Seats: | Sport Seats<br>Standard |

*FIG. 4A*

| Characteristics | Characteristic Values |
|---|---|
| Exterior Color: | Red<br>Blue<br>Black<br>Green |
| Air Conditioning: | Manual Air Conditioning<br>Automatic Air Conditioning<br>No |
| Seat Heating: | Yes<br>No |
| Airbags: | Driver<br>Passenger<br>Side Curtain |
| Steering Wheel: | Leather Multifunction<br>Wood |
| Seats: | Sport Seats<br>Standard |
| Battery: | Reinforced<br>Not Reinforced |

*FIG. 4B*

| Characteristics | Characteristic Values |
|---|---|
| Exterior Color: | Red<br>Blue<br>Black<br>Green |
| Air Conditioning: | Manual Air Conditioning<br>Automatic Air Conditioning<br>No |
| Seat Heating: | Yes<br>No |
| Airbags: | Driver<br>Passenger<br>Side Curtain |
| Steering Wheel: | Leather Multifunction<br>Wood |
| Seats: | Sport Seats<br>Standard |
| Constraints ||
| Constraint: If Exterior Color is Black, Then Air Conditioning is Automatic Air Conditioning ||

FIG. 4C

| Characteristics | Characteristic Values |
|---|---|
| Exterior Color: | Red<br>Blue<br>Black |
| Air Conditioning: | Manual Air Conditioning<br>Automatic Air Conditioning<br>No |
| Seat Heating: | Yes<br>No |
| Airbags: | Driver<br>Passenger<br>Side Curtain |
| Steering Wheel: | Leather Multifunction<br>Wood |
| Seats: | Sport Seats<br>Standard |
| Constraints ||
| Constraints: If Exterior Color is Black, Then Air Conditioning is Automatic Air Conditioning ||

*FIG. 4D*

| Characteristics | Characteristic Values |
|---|---|
| Exterior Color: | Red<br>Blue<br>Black<br>Green |
| Air Conditioning: | Manual Air Conditioning<br>Automatic Air Conditioning<br>No |
| Airbags: | Driver<br>Passenger<br>Side Curtain |
| Steering Wheel: | Leather Multifunction<br>Wood |
| Seats: | Sport Seats<br>Standard |
| Sports Package: | Automatic Air, Leather Multifunctional, Sport Seats |

| Constraints |
|---|
| Constraint: If Exterior Color is Black, Then Air Conditioning is Automatic Air Conditioning |

*FIG. 4E*

RE-USABLE ELEMENTS OF A CONFIGURATION MODEL

CROSS-REFERENCE TO RELATED APPLICATIONS

This application is a continuation-in-part of U.S. patent application Ser. No. 10/291,175, entitled "Multi-Purpose Configuration Model", filed on Nov. 7, 2002, which claims the priority of U.S. Provisional Application Ser. No. 60/338,105 filed Nov. 7, 2001, both of which are hereby incorporated by reference in their entireties.

BACKGROUND

The present invention relates to data processing, and more particularly to product modeling.

Business enterprises can generally design, build, and sell one or more products such as, for example, a car. A product such as a car can be configurable. That is, the product can have characteristics that can be varied. For example, a characteristic of a car that can vary is the number of doors. The car can be a sedan or a coupe. There are other characteristics, such as engine size, wheel size, body color, and type of seats, which are configurable.

Business enterprises can use computer systems to facilitate operations such as product design. One example of such systems is a product modeling system. Generally, product modeling of a product refers to a process, usually implemented in a computer system, which defines a model that represents the product. Defining a configurable product can include, for example, specifying characteristics, characteristic values, constraints describing dependencies of the characteristics, default values, values ranges, and other parts of the product. These items can be specified in a configuration model. The configuration model is generally some collection of this information that is needed to configure the product. The configuration model can be an element of the overall product model. The parts of the product can be specified in a product structure that can also be an element of the overall product model.

The configuration model is generally the basis for configuring of a product. For example, the configuration model can include criteria that determine the configuration of the product. Criteria can include, for example, constraints specifying that a particular type of wheel must be used for a particular type of engine.

SUMMARY

The present invention provides methods and apparatus, including computer program products, for a multi-purpose configuration model.

In one implementation, a method for defining a configuration model for a configurable product by reusing subcomponents begins with receiving input from a user that is used in defining the configuration model. The system uses the input to define a base component of the configuration model, where the base component includes information that describes the product. The system then includes, in the configuration model, a reused subcomponent that was previously defined in a second configuration model, the reused subcomponent including information that describes the product. The previously defined reused subcomponent can be supplied by establishing a link between the first configuration model and the reused subcomponent while the reused subcomponent is still located within the second configuration model. Alternatively, the previously defined reused subcomponent can be copied from the second configuration model and then added to the present configuration model. The information that describes the product, which is contained within the subcomponent, includes but is not limited to any combination of characteristics of the product, characteristic values, constraints describing dependencies of the characteristics, default values, value ranges, classes, and other parts of the product.

In another implementation, a method for defining an abstract configuration model for a product begins by receiving an input from a user. The system uses the input to define a generic base component of the configuration model, the generic base component formed from one of more subcomponents, each subcomponent including information that generically describes the product. The system also defines, based on the input, a generic first component of the configuration model. The generic first component is also formed from one of more subcomponents, each subcomponent now including information that generically describes the product and being associated with a generic business process. The system can then generate a first view of the abstract configuration model that includes information generically describing the product, and a second view generically describing the product and that is associated with the generic business process. The system can also define, based on the input, a generic second component of the configuration model, the generic second component including information which inclusion is based on a role of a user or on an access authorization.

BRIEF DESCRIPTION OF THE DRAWINGS

FIGS. 3A–E show examples of information included in components of the implementation.

FIG. 4A–E show examples of views of the implementation.

Like reference numbers and designations in the various drawings indicate like elements.

DETAILED DESCRIPTION

Figure 1:
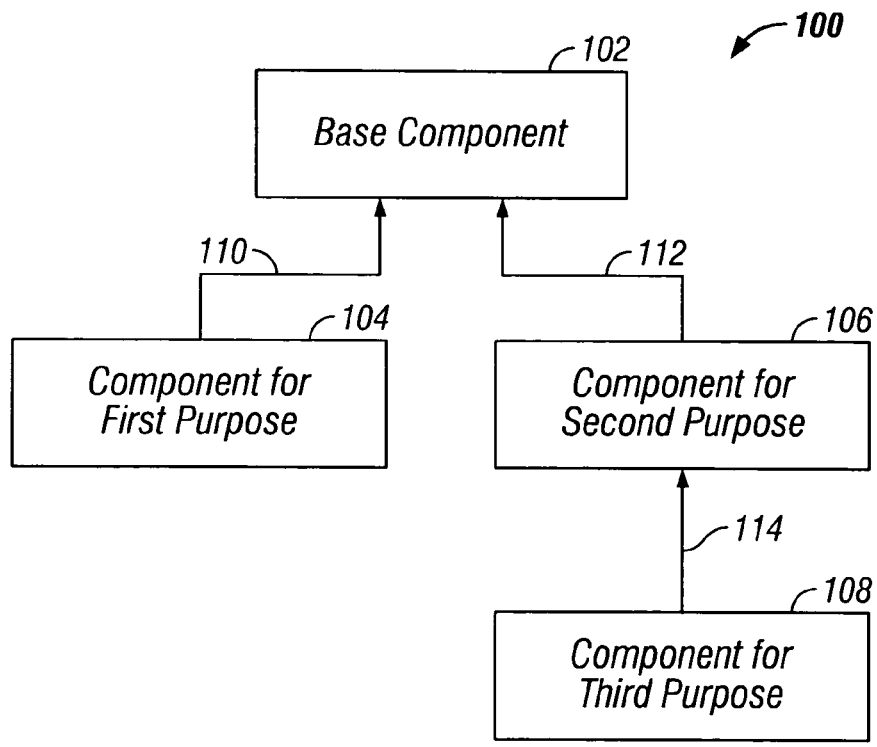
FIG. 1 shows a configuration model that includes different components.

FIG. 1 shows a configuration model 100 that describes a product. The model includes a base component 102, a component 104 for a first purpose, a component 106 for a second purpose, and a component 108 for a third purpose. Alternatively, other components can be included for other purposes. The configuration model can have only a single component.

Each component is formed from one or more subcomponents. Each subcomponent contains one or more elements used to define the configuration model, which can include but are not limited to characteristics of the product, characteristic values, constraints describing dependencies of the characteristics, default values, value ranges, prices of the product, costs of the product, classes, and other parts of the product.

The characteristics of the product refer to some aspect, such as "color", of the product. Characteristic values, such as "blue", specify the aspect. For example, blue specifies the color of the product. The constraints describe dependencies between or among characteristics. Constraints can also serve other functions. A system can, for example, determine whether an instance of a configuration model is consistent and complete. The instance is consistent if all constraints of the model are satisfied. The instance is complete if all required characteristics and elements of the configuration model are included. Constraints are further described below.

Price refers to a monetary value at which a product is sold. Cost refers to a monetary value at which the product or its components are built or procured.

A class, in this specification, refers to a collection of similar objects. Cars that have two doors, for example, can be grouped in a class called coupes. Cars that have four doors, for example, can be grouped in a class called sedans. Each component can include one or more classes. For example, a base component of a configuration model for a car can have two classes of cars, sedans and coupes. Sedans can inherit information from and add information to cars. Similarly, coupes can inherit information from and add information to cars.

The configuration model can include links such as the link 110, the link 112, and the link 114. The links, which can be pointers, associate parent object and child object components. For example, the link 110 associates the base component 102 and the component 104. Furthermore, the link 110 specifies that the component 104 is a child object of the base component 102. Links can also exist between two or more configuration models. This is described in more detail below.

Components and subcomponents can have multiple versions. A version is a particular storage state of the component or subcomponent. Documents, for example, can have different versions. The described links can associate versions of components or subcomponents. For example, the base component 102 and the component 104 can each have a first version and a second version, and the link 110 can associate the first versions of these components. The link can also associate a first version of one component with a second version of another component. Subcomponents that are included in a particular component do not necessarily have the same version numbers. Different versions of each subcomponent can be used in forming a component. There is no limit to the number of versions a component or a subcomponent can have. The particular version of a component or a subcomponent that is active is known as the baseline component or subcomponent. Additional components or subcomponents are linked to the baseline component or subcomponent.

Child components can inherit from their respective parent components. That is, a child component can include all characteristics of the product, characteristic values, constraints, classes, prices of the product, and costs of the product. A child component generally further adapts the configuration model. For example, a child component, such as the component 108 can add one or more characteristics not included in a parent component, such as the component 106. The child component can also add one or more constraints to those of the parent component, as long as the new constraints do not contradict the constraints of the parent component. Each of the new constraints are generally added by means of one or more subcomponents that form the child component 106. The child component can set or change default values for characteristics included in the parent component. The child component can restrict ranges of characteristic values included in the parent component.

A purpose, in the context of the specification, can be a goal or task to be completed. A purpose can be, for example, the completion of some process, such as a business process. Business processes can include processes for product design, marketing, production, sales, engineering, and so forth. A purpose can further be a goal or task to be completed by a particular entity. For example, a purpose can be a sales process of a particular sales organization.

A system that defines the configuration model 100 can present different views of the configuration model 100 to a user. The different views can include different information, depending on the purpose and, hence, the component. For example, when there are no purposes specified, the system can present a view that includes only information included in the base component. For the first purpose, the system can present a second view that includes information included in the base component 102 and the component 104.

The system can also determine which information to present to a user based on whether the user has authorization to view or change information. That is, the system can determine, based on a user's role and authorization, which component of the configuration model to use.

Figure 2:
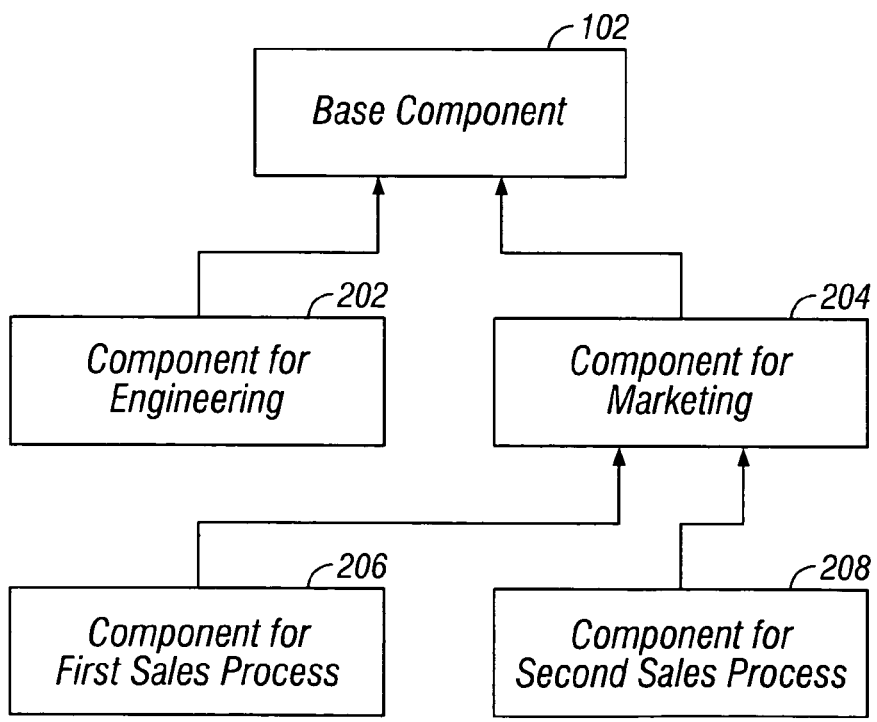
FIG. 2 shows an implementation of the configuration model.

FIG. 2 shows an implementation of the configuration model 100. The implementation includes the base component 102, a component for engineering 202, a component for marketing 204, a component 206 for a first sales process, and a component 208 for a second sales process. In this example, the first sales process can be one that is for northern Europe. The second sales process can be one that is for southern Europe. Alternatively, the implementation can further include a component for engineering, a component for a particular production plant, and a component for product design. The components can be implemented as subcomponents.

FIGS. 3A–E show examples of information included in the base component 102, the component for engineering 202, the component for marketing 204, the component 206 for the first sales process, and the component 208 for the second sales process. In the examples, the product is a car and the configuration model describes the car.

As shown in FIG. 3A, the basic component 102 includes characteristics and characteristic values. The characteristics include exterior color 302, air conditioning 304, seat heating 306, airbags 308, steering wheel 310, and seats 312. The characteristic values for color 302 include red 314, blue 316, black 318, and green 320. The characteristic values for air conditioning include manual air conditioning 322, automatic air conditioning 324, and no air conditioning 326. The characteristic value for seat heating include yes 328 and no 330. The characteristic values for airbags include driver 332, passenger 334, and side curtain 336. The characteristic values for steering wheel include leather multifunction 338 and wood 340. The characteristic values for seats include sport seats 342 and standard seats 344.

Each component can also describe default values. For example, the default value for air conditioning is no, the default value for seat heating is no, the default value for airbags is driver, and the default value of seats is standard. In one implementation, default values can be inherited but cannot be overwritten.

FIG. 4A shows an example view of base configuration model. The default values can be highlighted. A view of the base configuration model includes the above described characteristics and characteristic values.

As shown in FIG. 3B, the engineering component 202 includes an additional characteristic, such as battery 346, and additional characteristic values, such as reinforced 348 and not reinforced 350.

FIG. 4B shows an example view of the configuration model for engineering. A view of the engineering configuration model includes the characteristics and characteristic values of the base component 102 as well as the characteristic and characteristic values of the engineering component 202.

As shown in FIG. 3C, the marketing component 204 includes a constraint such as constraint 352. The constraint 352 specifies that there should be automatic air conditioning if the exterior color is black. FIG. 4C shows an example view of the configuration model for marketing. The view includes the characteristics and characteristic values included in the base component 102 and the constraint 352 included in the marketing component 204.

As shown in FIG. 3D, the component 206 for the first sales process has the same characteristics and constraint as the marketing component 204. However, the component 206 restricts the characteristic values for the exterior color. Specifically, the value green 320 has been excluded. FIG. 4D shows an example view of the configuration model for the first sales process.

As shown in FIG. 3E, the component 208 for the second sales process can include an additional characteristic, such as sports package 354, that has characteristic values of automatic air condition, leather multifunction, and sport seats. The default values of the component 208 are different from those described by the parent component, i.e., the marketing component 204. The default value for air conditioning is manual air instead of no, as is the case for the parent component. Some information, for instance the seat heating and its corresponding values, can be suppressed and, hence, are not shown in a corresponding view. Suppression hides but does not delete. FIG. 4E shows an example of the view of the configuration model for the second sales process.

Figure 5:
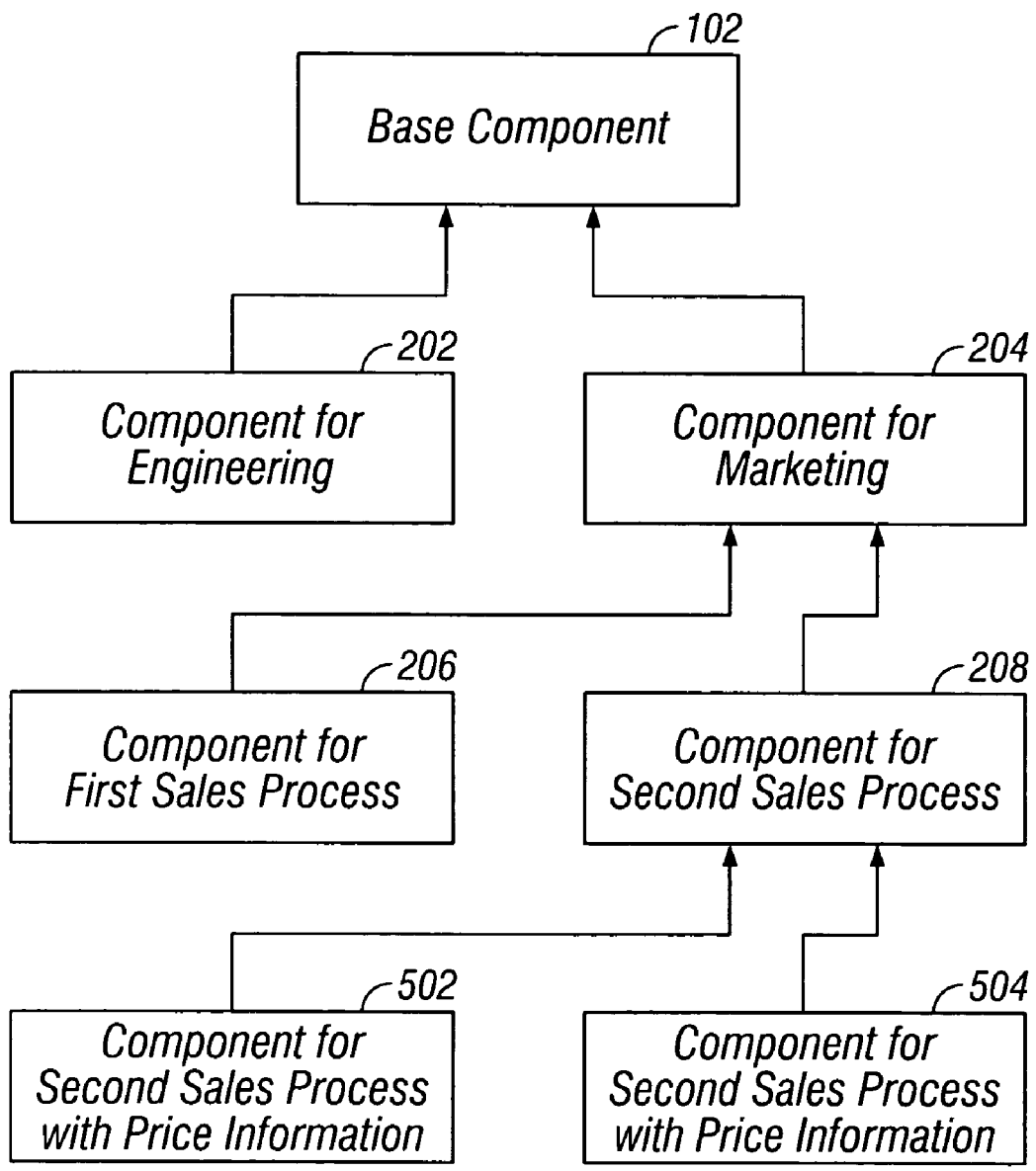
FIG. 5. illustrates role-based configuration modeling.

FIG. 5 shows another implementation of configuration model 100. In this implementation, the components can include information based on not only a business process but also on whether a user has authorization to access information. The implementation, for example, includes additional components 502 and 504 that include price information and, furthermore, which are only accessible to users having authority to view prices. Thus, users without authorization cannot access components 502 and 504 while users with authorization can access all components.

Figure 6:
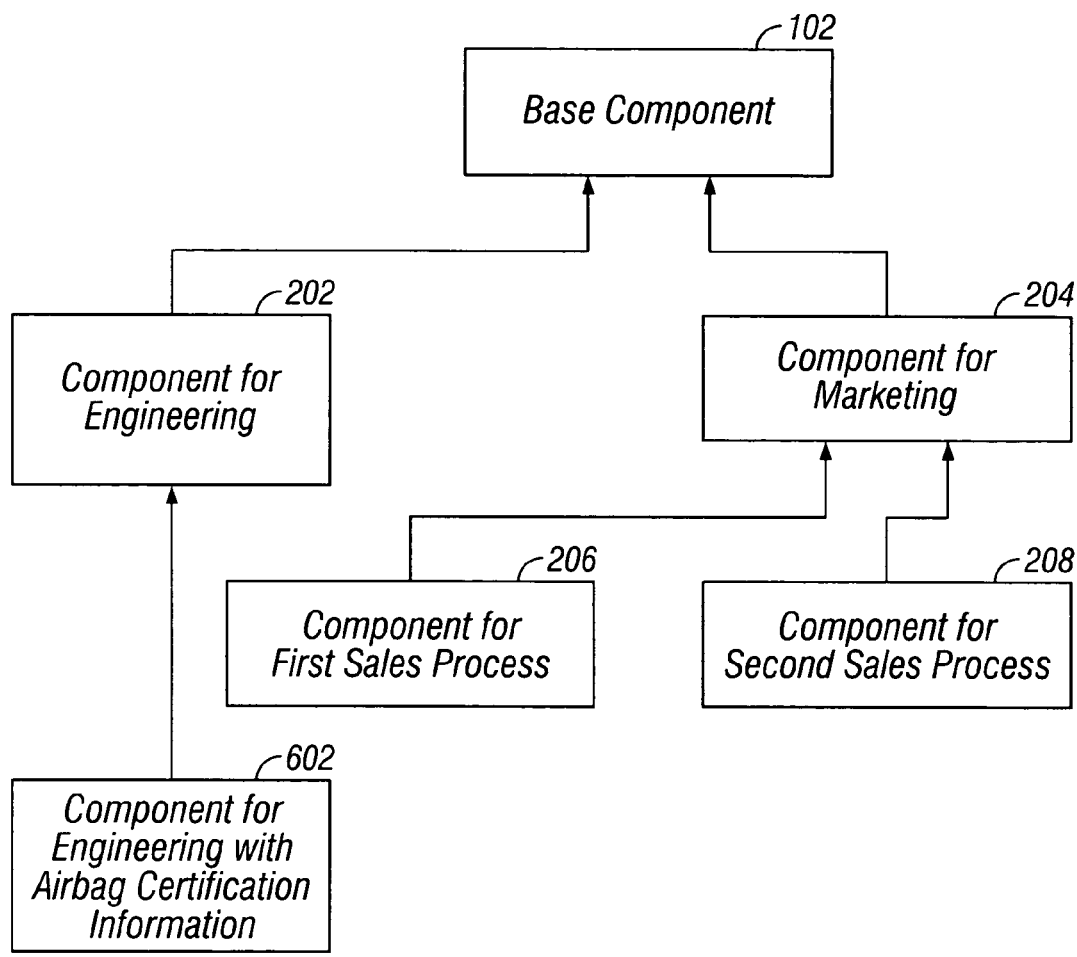
FIG. 6. illustrates access-authorization-based configuration modeling.

FIG. 6 shows another implementation of configuration model 100. In this implementation, the components can include information based not only on a business process but also on a role of the user. The implementation, for example, includes an additional component 602 that includes information about airbag certification. For users having a role that involves verifying airbags, the system presents information included in and inherited by the component 602. For users not having a role that involves certifying airbags, the system presents information inherited by and included in the component 202.

Figure 7:
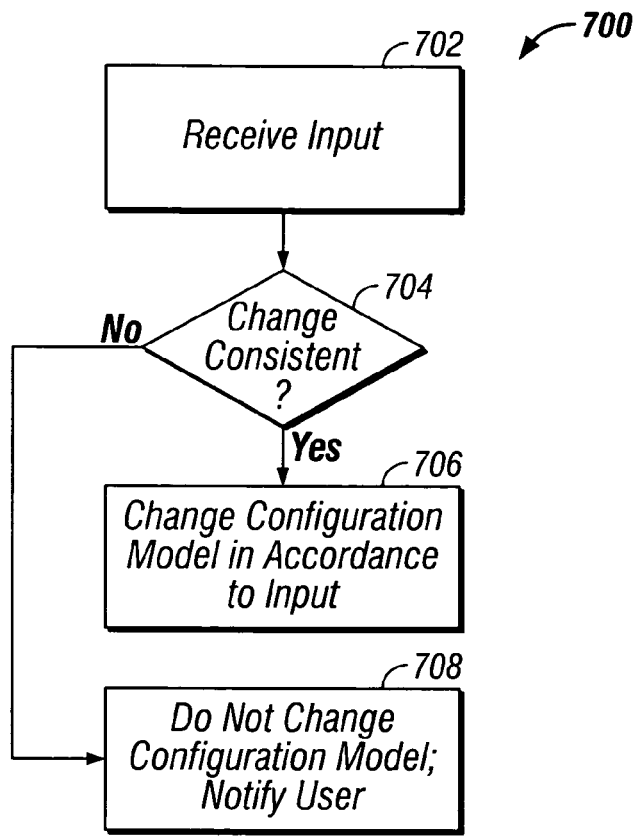
FIG. 7. shows a method for changing a configuration model.

FIG. 7 shows a method 700 for configuring a configuration model. As shown, the system receives input (step 702). The input can request the addition of a component, in which case the request specifies an existing component from which the new component will depend. Furthermore, the input can request actions such as adding characteristics, adding constraints, restricting ranges, and setting defaults, in which case the request specifies the component or components in which the change is to be made. The input can be from a user or other sources such as a computing system.

Optionally, the system can determine whether the source of the input is authorized to request the action specified in the request is permissible. If there is no authorization, the system can deny access. If the source is authorized for the action, the system can proceed. The system can deny access based on role, authorization, or both. The system can also deny access because an object to be changed has been locked or is being modified by a different component of the configuration model.

The system checks consistency (step 704). Checking consistency includes verifying that existing constraints, ranges, and default values inherited and included in a component being changed are not violated by the action requested by the input. If the action maintains consistency, then the system changes the configuration model in accordance to the input (step 706). Otherwise, the system does not make the change and notifies the user that the input cannot be processed (step 708).

Figure 8A:
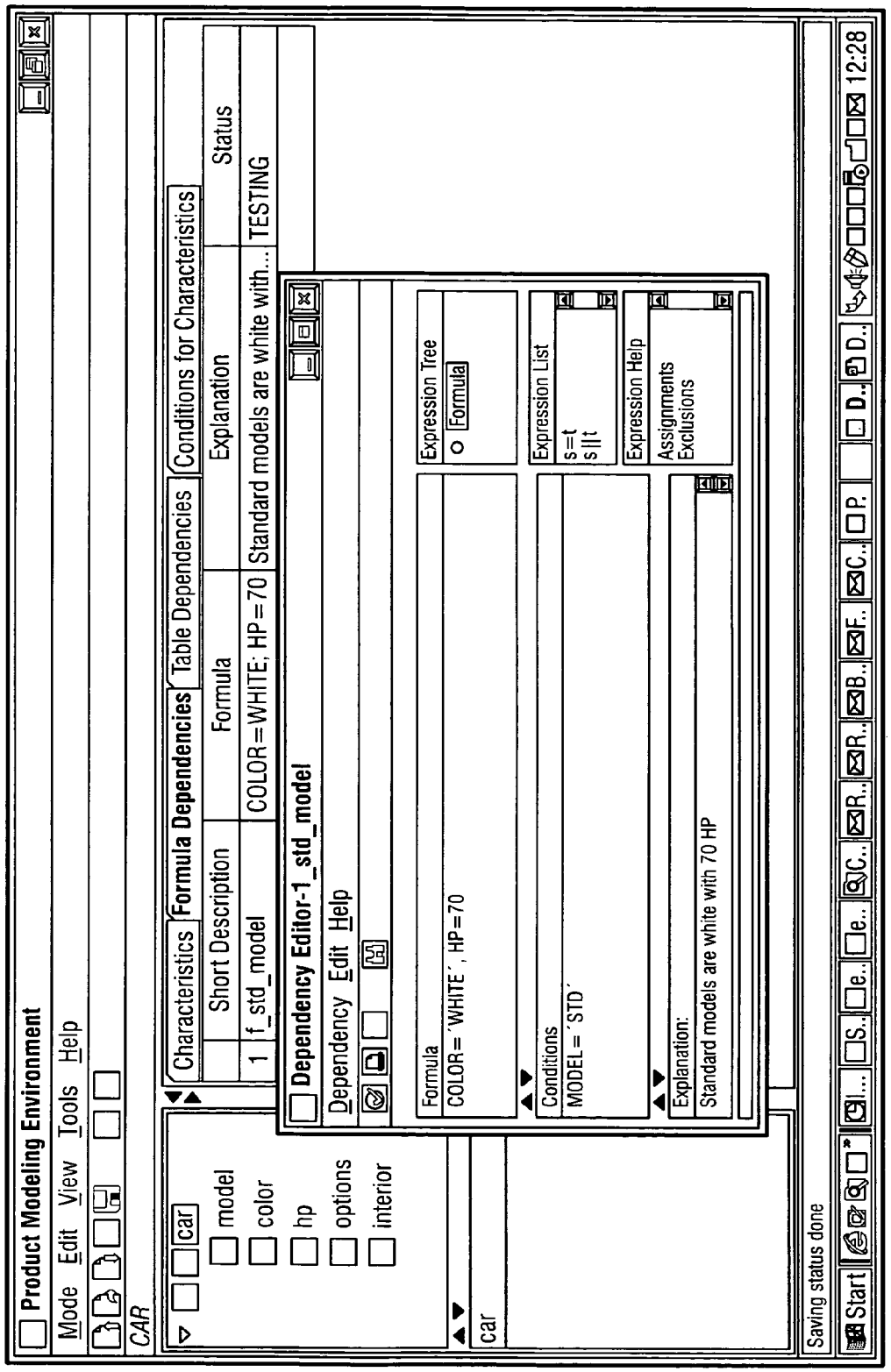
FIGS. 8A–C illustrates different techniques for defining constraints.
Figure 8B:
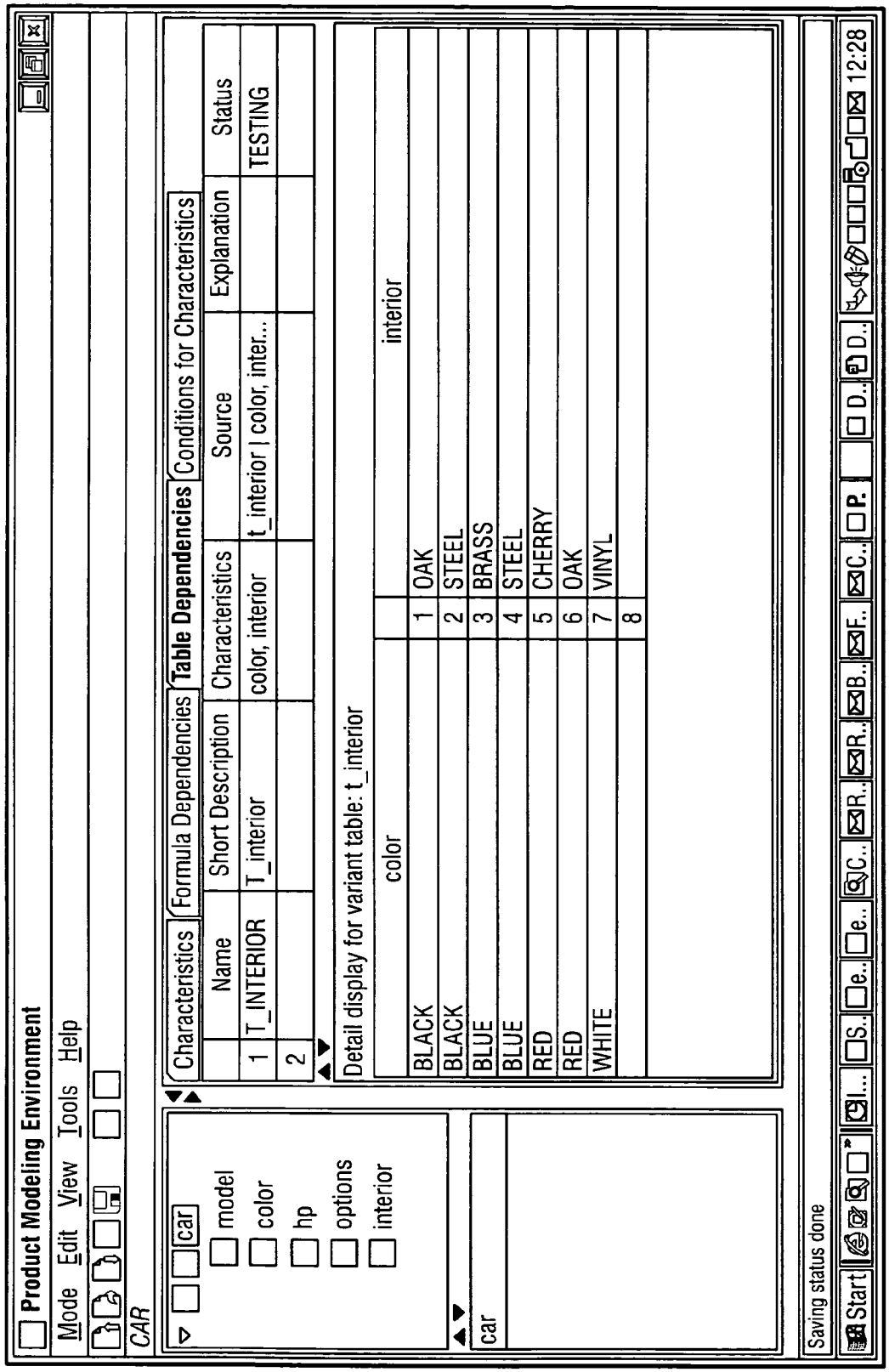
Figure 8C:
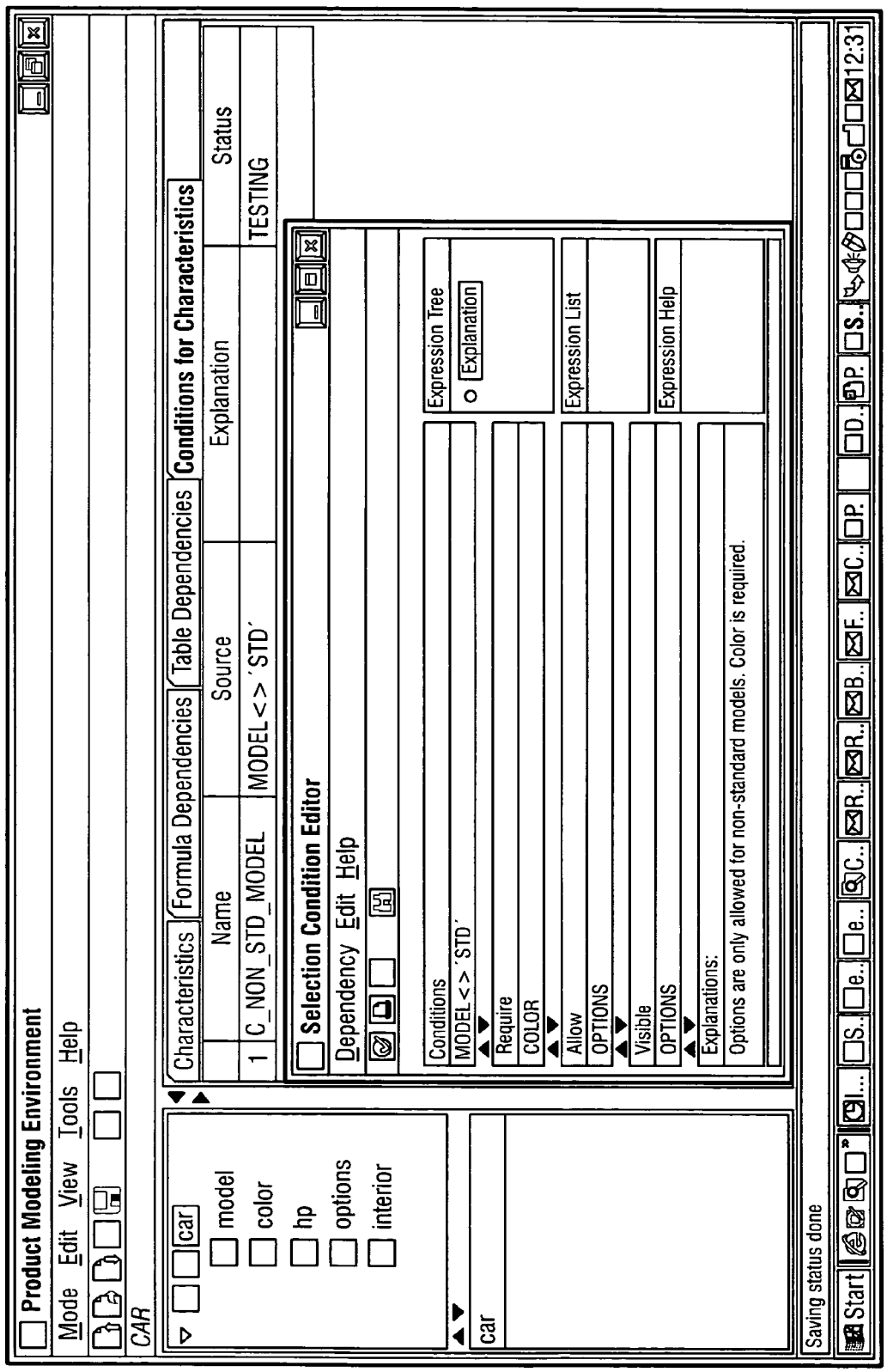

FIGS. 8A–C illustrates one implementation that includes three techniques for defining constraints (which are sometimes know as dependencies). The first technique uses formulas (also sometimes referred to as expressions). Generally, the formula is part of an IF-THEN statement. FIG. 8A shows a user interface that a user can use to define a constraint using the first technique. The user can enter into one window the IF (or the condition) part of the statement, which, in this example, is: if model is standard. The user can enter into another window the formula, which in this example, is: then color is white and horsepower is 70.

The second technique uses a table. As shown in FIG. 8B, the columns of the table can specify characteristics, such as colors and interior material, and the rows can specify characteristic values for the characteristics. Each row specifies a combination of characteristic values that is permissible. The table specifies all permissible combinations. For example, when exterior color is black, the interior material must be oak or steel.

The third technique uses conditions to specify which characteristics require characteristic values, which characteristics are allowed to have characteristic values, and which characteristics are shown in the configuration process. As shown in the example of FIG. 8C, when model is not standard, the characteristic called color is required and the characteristic called options is allowed and visible.

In one implementation, the configuration model includes: classes, characteristics, characteristic values, constraints, a product structure, configurable products, pricing information, estimated costs, and relationships between objects besides product structure. There can be more than one configuration model used in an enterprise. Typically, configuration models encompass similar products, such as all products in a product family.

The configuration model can be linked with a master data system of a hosting system where applicable. Certain characteristics and characteristic values can refer to global definitions in the master data system. For example, a characteristic listing the customer, business partner, or other business context information of the configuration model can be linked to corresponding business objects in the master data system.

In one implementation, the system can define a way for processes connected in a process chain to communicate with each other by stipulating that a configuration passed from one process to the next must be consistent and complete with respect to a common ancestor component model. This defining is referred to, in this specification, as process completion and requires action by both processes. The process that is handing off (i.e., the handing process) must remove characteristics and components that are not common to the common ancestor component model. The handing process may need to translate the stripped information into additional objects and characteristic value assignments at the level of the common ancestor component model. In the example of the car, a product sold in a particular sales region, e.g., a California Dune Buggy specified by fifteen characteristic values, may not directly correspond to a manufactured model. The properties specified when ordering one such car should, however, enable identification of the car as a manufacturable model TX500 specified by some fifty characteristic values (which are not relevant for sales, but which can be inferred from the original fifteen by the sales process).

The receiving process may have to augment the configuration by adding such characteristics and components from its own component model to allow useful processing. For example, the TX500 derived by sales process in the above example may need to be built in a manufacturing plant. The manufacturing process needs additional details (like battery size). This information may lead to some 200 characteristic values to be set that can be derived from the passed fifty characteristics.

In one implementation, several model component versions can be concurrently used operationally by the associated business process or entities. For example, cars can be ordered some time ahead of intended delivery. Cars to be delivered in April may need to be configured against a different model from those to be delivered in June. When creating a new version of a model component an explicit decision must be made to release the model for business use. To this end, each model component has a status. If changes need to be made for a model component that is in operational use, these changes must be tested before allowing them to become active. For this purpose, each model component has an active and an inactive state. The inactive state can be changed and tested without affecting the operational version. If the changes are approved, then the inactive state can be changed to an activate state, which causes the version to be replaced.

In one implementation, model components are the units of distribution of a model. A central sales model may be distributed to all (non-central) sales organizations. Distributing a model component pre-supposes that the ancestor versions the component references either have already been distributed or are being distributed along with the model component.

In one implementation, the system can provide a mechanism for importing and exporting model component versions. A data container that allows storing and shipping the data in a component is provided. Changes to a model component version can be exported and imported by them. When importing a change to a model component that is in operational use, the change may have to be imported in a staged way. It is first imported into the inactive state and later activated.

In an implementation, components and subcomponents that have been defined in one configuration model can be reused in other configuration models. This is advantageous when two or more configurable products have configuration models that are independent of each other, but the configuration models have at least one subcomponent or component that contains the same information. For example, if the configurable product is a car, there may be two different car models that come with the same three engine choices. The configuration models for the two cars will be independent of one another, but both configuration models will need one or more subcomponents that contain the same engine information. Once a user generates the engine subcomponents for one configuration model, the second configuration model can simply reuse these subcomponents rather than creating brand new subcomponents.

The reuse of subcomponents can be implemented in different ways. In one implementation, the reuse of subcomponents can be implemented by establishing an inter-model link between subcomponents of a first configuration model and subcomponents of a second configuration model. The subcomponents being reused stay within the structure of the first configuration model, but can now be accessed by the second configuration model as well through the inter-model link. The inter-model link creates a communication path between the two configuration models. The second configuration model retrieves information out of the subcomponents being reused from the first configuration model. The inter-model link technique is possible when information can be exchanged between configuration models.

There are several advantages to using inter-model links when reusing subcomponents. The inter-model link can reduce the consumption of memory space because subcomponents being reused are stored in only one location. The use of an inter-model link enables the system to update subcomponent versions. When a newer version of a subcomponent is activated, the link can be rerouted to the newer version of the subcomponent, thereby updating all configuration models that are reusing a particular subcomponent. With the link, the system can check consistency and consequences of a change with respect to subcomponents belonging to other configuration models. Modeling responsibility can be distributed over multiple configuration models when subcomponents are being reused by inter-model links. Inter-model links also allow for abstract or generic subcomponents to be used in the configuration models without those subcomponents having to belong to any particular component or business process.

In another implementation, subcomponents or components can be copied from a first configuration model and then inserted into a second configuration model. The first configuration model can be an existing one and the second configuration can be a new one. Any number of subcomponents or components can be copied. The copy and insert method is advantageous when the configuration models are stored in different locations, such as on different computer systems or within different data systems. In particular, this method is advantageous when the configuration models are stored such that they are unable to communicate with one another. Each configuration model will then need its own independent copy of the subcomponents.

The copy and insert method of reusing subcomponents is also useful when the information within the subcomponents will be changed or modified beyond changes usually made between versions, and the change or modification is specific to the configuration model in which the subcomponents reside. When two or more configuration models directly share the same subcomponent, the data cannot be altered for the benefit of just one of the configuration models. Making configuration model specific modifications is only possible when each configuration model has its own copy of the subcomponents.

In another implementation, the reusable subcomponents can be stored in a location that is independent of any configuration model. The subcomponents can then be linked to each configuration model that needs to use it. This can be done when the user knows ahead of time that the information in the subcomponent will be used in multiple configuration models. The subcomponent can be defined in one location, and the configuration models can be linked to the subcomponent as needed. This allows multiple users to collaborate in the modeling process. In yet another implementation, the reusable location can be another location within the same configuration model. A link can be an intra-model link. That is, the link can then be established within the same configuration model so that multiple branches of the configuration model can use the same subcomponent.

The reuse of subcomponents can greatly reduce the time required to input data when generating a configuration model. This is because these subcomponents often contain large amounts of data, and therefore a lot of user hours can be expended in entering the data. This is particularly true when the subcomponents being reused form an entire component, thereby containing data for an entire business process. If a user is defining another configuration model that will have subcomponents that are identical to subcomponents in an existing configuration model, the reuse of these subcomponents will save the user from having to reenter all of the data once again.

The information that is shared by reusing subcomponents can be of any type. For example, if the marketing department is doing the same promotion for several different car models, the configuration models for each of those cars can use the same marketing subcomponents, including the same entire marketing component if necessary. A user can enter the marketing information into subcomponents for one configuration model, and those subcomponents can then be copied and inserted into the configuration models for other cars that are part of the promotion. Alternatively, the marketing subcomponents can be entered in the configuration model for one car, and those subcomponents can then be linked into the configuration models for the other cars. In another implementation, the marketing subcomponents can be stored outside of any particular configuration model, and then each of the configuration models that require the marketing subcomponents can be linked to it. Component types, including but not limited to product design, production, engineering, and sales, can be reused as well.

Figure 9:
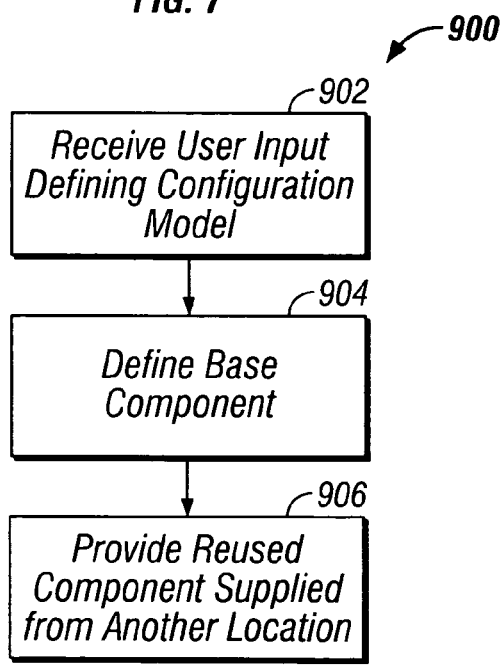
FIG. 9 shows a method for defining a configuration model by reusing subcomponents.

FIG. 9 shows one implementation of a method 900 for defining a first configuration model for a product by reusing subcomponents. Method 900 begins with receiving input from a user that is used in defining the first configuration model (step 902). The system then uses the input to define a first component of the first configuration model (step 904), where the first component includes information that describes the product. The first component can be a base component, as described above, or it can be any other type of component described herein, such as a component that is associated with a business process. The system then provides a reused subcomponent for the configuration model that was previously defined and supplied from another location (step 906), typically a second configuration model. The reused subcomponent includes further information that describes the product, and is implemented as a child object of the first component. As noted above, the reused subcomponent can be supplied by establishing a link between the first component and the reused subcomponent while the reused subcomponent is still located within the second configuration model. Alternatively, the reused subcomponent can be copied from the second configuration model and then added to the first configuration model as a child object of the first component.

One or more reused subcomponents can be joined with non-reused subcomponents to form a component of the first configuration model, or a component can be formed entirely from reused subcomponents. It should be noted that as above, the information that describes the product includes, but is not limited to, any combination of characteristics, characteristic values, constraints describing dependencies of the characteristics, default values, and values ranges. If the component is used for a business process, the business process can include, but is not limited to, one of marketing, product design, production, engineering, and sales.

Figure 10:
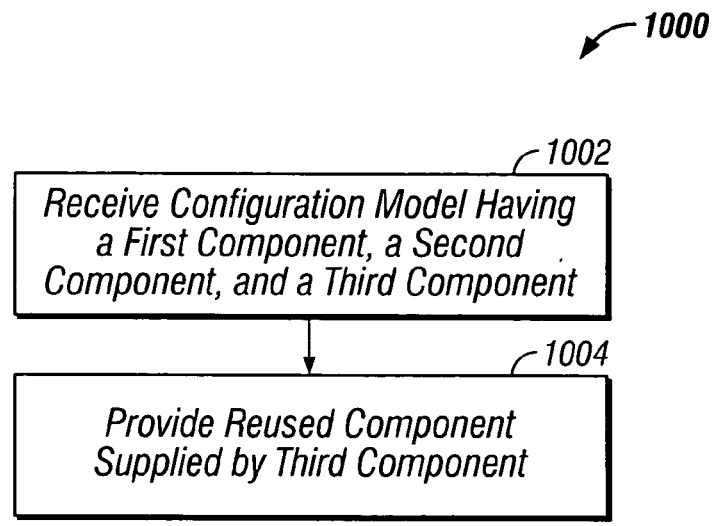
FIG. 10 shows another method for defining a configuration model by reusing subcomponents.

FIG. 10 shows an alternative implementation of a method 1000 for defining a configuration model for a product by reusing subcomponents. This implementation begins by receiving a configuration model that has a first component, a second component, and a first subcomponent (step 1002), where each component and subcomponent includes information that describes the product and can be associated with a business process, and where the first subcomponent is a child object of the second component. Next, the system provides a reused subcomponent as a child object of the first component, where the reused subcomponent is supplied by the first subcomponent (step 1004). The first subcomponent can be copied and then added to the configuration model as a child object of the first component, or a link can be established between the first subcomponent and the first component while the first subcomponent is still linked to the second component.

In one implementation, an abstract configuration model that generically describes a product can be defined. The abstract configuration model can include a generic base component. The abstract configuration model can include one or more components for a generic purpose. The generic components do not necessarily belong to a particular business process such as marketing or engineering. Rather, the generic components describe general objects that can be used in many different contexts. These generic components can be implemented in actual configuration models in a number of different ways.

In one implementation, the abstract configuration model is not associated with any particular product. Although the abstract configuration model is not associated with any particular product, it can be associated with a particular version if desired. Thus, an abstract configuration model can have multiple versions. The abstract configuration model can serve as a baseline for a particular product. The abstract configuration model can also be linked to other configuration models, including abstract and non-abstract configuration models.

The abstract configuration model can perform all of the same functions as a non-abstract configuration model. The system can generate a first view and a second view of the abstract configuration model. The first view can include information that generically describes the product. The second view can include information that generically describes the product for some generic process. The views can be based on the role or access authorization of the user, so that only information needed by the user is shown. The generic components can be used for any of the processes described above, including marketing, product design, production, engineering, and sales.

Figure 11:
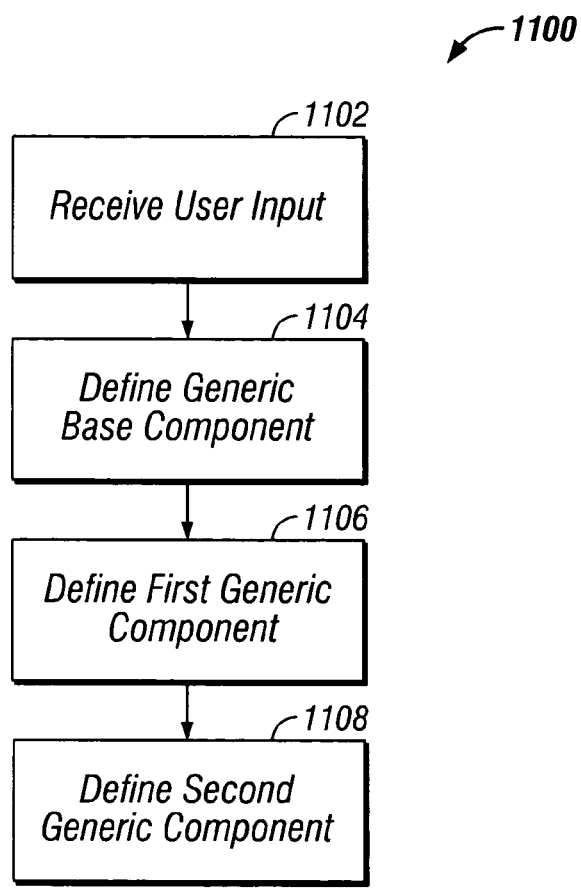
FIG. 11 shows a method for defining an abstract configuration model for a product.

FIG. 11 shows a method 1100 for defining an abstract configuration model for a product. This method 1100 begins by receiving an input from a user (step 1102). The system uses the input to define a generic base component of the configuration model, the generic base component including information that generically describes the product (step 1104). The system also defines, based on the input, a first generic component of the configuration model (step 1106). The first generic component includes information that generically describes the product and is associated with a generic business process. The system can then generate a first view of the abstract configuration model that includes information generically describing the product, and a second view generically describing the product and that is associated with a generic process. The system can also define, based on the input, a second generic component of the configuration model (step 1108), the second generic component including information which inclusion is based on a role of a user or on an access authorization.

The invention can be implemented in digital electronic circuitry, or in computer hardware, firmware, software, or in combinations of them. The invention can be implemented as a computer program product, i.e., a computer program tangibly embodied in an information carrier, e.g., in a machine-readable storage device or in a propagated signal, for execution by, or to control the operation of, data processing apparatus, e.g., a programmable processor, a computer, or multiple computers. A computer program can be written in any form of programming language, including compiled or interpreted languages, and it can be deployed in any form, including as a stand-alone program or as a verification module, component, subroutine, or other unit suitable for use in a computing environment. A computer program can be deployed to be executed on one computer or on multiple computers at one site or distributed across multiple sites and interconnected by a communication network.

Method steps of the invention can be performed by one or more programmable processors executing a computer program to perform functions of the invention by operating on input data and generating output. Method steps can also be performed by, and apparatus of the invention can be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for executing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. Information carriers suitable for embodying computer program instructions and data include all forms of non-volatile memory, including by way of example semiconductor memory devices, e.g., EPROM, EEPROM, and flash memory devices; magnetic disks such as internal hard disks and removable disks; magneto-optical disks; and CD-ROM and DVD-ROM disks. The processor and the memory can be supplemented by, or incorporated in special purpose logic circuitry.

The invention has been described in terms of particular embodiments. Other embodiments are within the scope of the following claims. For example, the steps of the invention can be performed in a different order and still achieve desirable results. The configuration model can be applied to any product and is not limited to those described. For example, the configuration model can describe configurable computer systems. The configuration model can be adapted for purposes other than those listed. For example, the configuration model can be adapted for a business process for advertising. The system can be any computing system that includes programs having instructions to perform the described actions and operations. A product model can include subcomponents and components other than the described configuration model and the product structure. For example, a product model can also include documents, routing information, line design information, and material information. The system can use any technique for defining constraints and is not limited to using those described in reference to FIGS. 8A–C.

What is claimed is:

1. A method for defining a configuration model for a configurable product comprising:
   receiving an input electronically;
   defining, based on the input, a first component of the configuration model, the first component including information that describes the product; and
   adding to the configuration model, as a child object of the first component, a reused subcomponent that was previously defined, the reused subcomponent including further information that describes the product.

2. The method of claim 1, wherein the reused subcomponent was previously defined in a second configuration model.

3. The method of claim 2, wherein including the reused subcomponent comprises establishing a link between the first component and the reused subcomponent while the reused subcomponent is located within the second configuration model.

4. The method of claim 2, wherein including the reused subcomponent comprises copying the reused subcomponent from the second configuration model and inserting it into the configuration model.

5. The method of claim 1, wherein the reused subcomponent was previously defined in the configuration model.

6. The method of claim 5, wherein including the reused subcomponent comprises establishing a link between the first component and the reused subcomponent while the reused subcomponent is located within the configuration model.

7. The method of claim 5, wherein including the reused subcomponent comprises copying the reused subcomponent and inserting it into the configuration model.

8. The method of claim 1, wherein the reused subcomponent is joined with one or more non-reused subcomponents to form a second component.

9. The method of claim 1, wherein the reused subcomponent is joined with one or more additional reused subcomponents to form a second component.

10. The method of claim 1, wherein the reused subcomponent includes information that describes the configurable product, wherein the information includes one or more of characteristics of the product, characteristic values, constraints describing dependencies of the characteristics, default values, value ranges, prices of the product, costs of the product, classes, and parts of the product.

11. The method of claim 1, wherein the reused subcomponent is associated with a business process, the business process comprising one of marketing, product design, production, engineering, and sales.

12. A method for defining a configuration model for a configurable product comprising:
    receiving a configuration model electronically, the configuration model including a first component, a second component, and a first subcomponent, each component and subcomponent including information that describes the product, wherein the first subcomponent is a child object of the second component; and
    reusing the first subcomponent to create a child object for the first component.

13. The method of claim 12, wherein reusing the first subcomponent comprises establishing a link between the first subcomponent and the first component.

14. The method of claim 12, wherein reusing the first subcomponent comprises copying the first subcomponent and inserting it into the configuration model as a child object of the first component.

15. A computer program product, tangibly stored on a machine-readable medium, for defining a configuration model for a configurable product, comprising instructions operable to cause a programmable processor to:
    receive an input;
    define, based on the input, a first component of the configuration model, the first component including information that describes the product; and
    adding to the configuration model, as a child object of the first component, a reused subcomponent that was previously defined, the reused subcomponent including further information that describes the product.

16. The product of claim 15, wherein the reused subcomponent was previously defined in a second configuration model.

17. The product of claim 16, wherein the instructions to include the reused subcomponent comprise instructions to establish a link between the first component and the reused subcomponent while the reused subcomponent is located within the second configuration model.

18. The product of claim 16, wherein the instructions to include the reused subcomponent comprise instructions to copy the reused subcomponent from the second configuration model and insert it into the configuration model.

19. The product of claim 15, wherein the reused subcomponent was previously defined in the configuration model.

20. The product of claim 19, wherein the instructions to include the reused subcomponent comprise instructions to establish a link between the first component and the reused subcomponent while the reused subcomponent is located within the configuration model.

21. The product of claim 19, wherein the instructions to include the reused subcomponent comprise instructions to copy the reused subcomponent and insert it into the configuration model.

22. The product of claim 15, wherein the reused subcomponent is joined with one or more non-reused subcomponents to form a second component.

23. The product of claim 15, wherein the reused subcomponent is joined with one or more additional reused subcomponents to form a second component.

24. The product of claim 15, wherein the reused subcomponent includes information that describes the configurable product, wherein the information includes one or more of characteristics of the product, characteristic values, constraints describing dependencies of the characteristics, default values, value ranges, prices of the product, costs of the product, classes, and parts of the product.

25. The product of claim 15, wherein the reused subcomponent is associated with a business process, the business process comprising one of marketing, product design, production, engineering, and sales.

26. A method for defining an abstract configuration model for a product comprising:
    receiving an input electronically;
    defining, based on the input, a generic base component of the configuration model, the generic base component including information that generically describes the product;
    defining, based on the input, a generic first component of the configuration model, the generic first component including information that generically describes the product and that is associated with a generic business process; and
    storing, in a machine, a generic second component in the configuration model, wherein the generic second component is a previous version of the generic first component.

27. The method of claim 26, further comprising:
    generating a first view of the abstract configuration model, the first view including information that generically describes the product; and
    generating a second view of the product, the second view including information that generically describes the product and that is associated with the generic business process.

28. The method of claim 26, further comprising:
    defining, based on the input, a generic second component of the configuration model, the generic second component including information that generically describes the product; and
    checking that the information included in the generic second component does not violate information included in the generic first component.

29. The method of claim 28, wherein the generic second component includes information that inclusion is based on a role of a user.

30. The method of claim 28, wherein the generic second component includes information that inclusion is based on an access authorization.

31. The method of claim 28, further comprising:
    generating a first view of the abstract configuration model, the first view including information that generically describes the product;
    generating a second view of the product, the second view including information that generically describes the product and that is associated with the generic business process; and
    generating a third view of the abstract configuration model, the third view including information included in the generic first component and information included in the generic second component.

32. A computer program product, tangibly stored on a machine-readable medium, for defining an abstract configuration model for a product, comprising instructions operable to cause a programmable processor to:
    receive an input;
    define, based on the input, a generic base component of the configuration model, the generic base component including information that generically describes the product; and define, based on the input, a generic first component of the configuration model, the generic first component including information that generically describes the product and that is associated with a generic business process; and store a generic second component in the configuration model, wherein the generic second component is a previous version of the generic first component.

33. The product of claim 32, further comprising instructions to:

generate a first view of the abstract configuration model, the first view including information that generically describes the product; and generate a second view of the product, the second view including information that generically describes the product and that is associated with the generic business process.

34. The product of claim 32, further comprising instructions to:

define, based on the input, a generic second component of the configuration model, the generic second component including information that generically describes the product; and check that the information included in the generic second component does not violate information included in the generic first component.

35. The product of claim 34, wherein the generic second component includes information that inclusion is based on a role of a user.

36. The product of claim 34, wherein the generic second component includes information that inclusion is based on an access authorization.

37. The product of claim 34, further comprising instructions to:

generate a first view of the abstract configuration model, the first view including information that generically describes the product;

generate a second view of the product, the second view including information that generically describes the product and that is associated with the generic business process; and generating a third view of the abstract configuration model, the third view including information included in the generic first component and information included in the generic second component.

* * * * *